(12) United States Patent
Furuyama

(10) Patent No.: US 7,747,116 B2
(45) Date of Patent: Jun. 29, 2010

(54) FLEXIBLE OPTOELECTRIC INTERCONNECT AND METHOD FOR MANUFACTURING SAME

(75) Inventor: Hideto Furuyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

(21) Appl. No.: 12/204,467

(22) Filed: Sep. 4, 2008

(65) Prior Publication Data

US 2009/0067779 A1      Mar. 12, 2009

(30) Foreign Application Priority Data

Sep. 5, 2007    (JP) .............................. 2007-230754
Mar. 31, 2008   (JP) .............................. 2008-093941

(51) Int. Cl.
  *G02B 6/30*    (2006.01)
  *G02B 6/12*    (2006.01)
  *G02B 6/26*    (2006.01)
  *G02B 6/42*    (2006.01)

(52) U.S. Cl. .............................. 385/49; 385/14; 385/31; 385/39; 385/40; 385/47; 385/88; 385/89; 385/114

(58) Field of Classification Search ................... 385/14, 385/47, 49, 89
See application file for complete search history.

(56) References Cited

U.S. PATENT DOCUMENTS

| | | | |
|---|---|---|---|
| 6,799,902 | B2 | 10/2004 | Anderson et al. |
| 6,912,332 | B2 | 6/2005 | Han et al. |
| 7,106,766 | B2 | 9/2006 | Ishida et al. |
| 2004/0218372 | A1* | 11/2004 | Hamasaki et al. ........... 361/767 |
| 2005/0230795 | A1* | 10/2005 | Furuyama et al. ........... 257/678 |
| 2006/0038287 | A1* | 2/2006 | Hamasaki et al. ........... 257/726 |
| 2006/0050493 | A1* | 3/2006 | Hamasaki et al. ........... 361/767 |
| 2006/0192278 | A1* | 8/2006 | Furuyama et al. ........... 257/686 |
| 2007/0183719 | A1 | 8/2007 | Lee et al. |
| 2008/0181561 | A1 | 7/2008 | Furuyama |

FOREIGN PATENT DOCUMENTS

JP    2-118942    9/1990

(Continued)

OTHER PUBLICATIONS

Hiroshi Hamasaki, et al. "Novel Optoelectronic LSI Packaging Suitable for Standard FR-4 Printed Wiring Board with Bandwidth Capability of Over 1 Tbps", The 46$^{th}$ Electronic Components and Technology Conference, 2006, pp. 298-302.

*Primary Examiner*—Ryan Lepisto
(74) *Attorney, Agent, or Firm*—Oblon, Spivak, McClelland, Maier & Neustadt, L.L.P.

(57) ABSTRACT

A flexible optoelectric interconnect including an optoelectric film, a driving IC, an optical semiconductor device, a heat dissipation plate and a thermally conductive material. The optoelectric film has an electrical interconnect layer made of a single layer and an optical interconnect layer including an optical waveguide core and an optical waveguide clad. The optoelectric film has a through hole extending from a major surface thereof to a rear surface opposite to the major surface. The driving IC is provided on the major surface of the optoelectric film and electrically connected to the electrical interconnect layer, and provided above the through hole in the optoelectric film. The optical semiconductor device is provided on the major surface of the optoelectric film and driven by the driving IC.

20 Claims, 5 Drawing Sheets

FOREIGN PATENT DOCUMENTS

| | | |
|---|---|---|
| JP | 5-21488 | 3/1993 |
| JP | 2002-176123 | 6/2002 |
| JP | 2003-227951 | 8/2003 |
| JP | 2006-4529 | 1/2006 |
| JP | 2007-48858 | 2/2007 |

* cited by examiner

FLEXIBLE OPTOELECTRIC INTERCONNECT AND METHOD FOR MANUFACTURING SAME

CROSS-REFERENCE TO RELATED APPLICATION

This application is based upon and claims the benefits of priorities from the prior Japanese Patent Application No. 2007-230754, filed on Sep. 5, 2007, and the prior Japanese Patent Application No. 2008-093941, filed on Mar. 31, 2008; the entire contents of which are incorporated herein by reference.

BACKGROUND OF THE INVENTION

The performance improvement of electronic devices such as bipolar transistors and field-effect transistors has dramatically increased the operating speed of large-scale integrated circuits (LSI). However, despite the speed-up of the internal operation of LSI, the operating speed at the level of the printed circuit board on which the LSI is mounted is set lower than the operating speed of the LSI, and the operating speed at the level of the rack on which the printed circuit board is installed is set even lower.

These are attributed to the increase of transmission loss, noise, and electromagnetic interference associated with the increase of operating frequency, because a longer interconnect requires a lower operating frequency in order to avoid degradation in signal quality. Hence, in electrically interconnected apparatuses, even if the operating speed of LSI, which is an active device, is increased, the speed is unfortunately forced to decrease when mounted. Thus, a recent growing trend is that mounting technology is more dominant in system speed than LSI operating speed.

In view of the foregoing problem with electrically interconnected apparatuses, some proposals have been made for an optically interconnected apparatus, which includes optical interconnection between LSIs. An optically interconnected apparatus is characterized by having little frequency dependence of loss in the frequency range from DC to 100 GHz or more, and being free from electromagnetic interference with the interconnect path and from noise due to ground potential difference. Thus, interconnection at several 10 Gbps can be easily realized. Hence, the optically interconnected apparatus can be expected to operate at very high speed even at the level of the printed circuit board and rack.

In particular, because of its flexibility, an optoelectric composite interconnect of the flexible type provides a high degree of freedom in board mounting. Furthermore, the configuration is simplified because it includes electrodes for mounting an optical device in itself (e.g., JP-A 2003-227951 (Kokai)).

SUMMARY OF THE INVENTION

According to an aspect of the invention, there is provided a flexible optoelectric interconnect including: an optoelectric film having an electrical interconnect layer made of a single layer and an optical interconnect layer including an optical waveguide core and an optical waveguide clad, the optoelectric film having a through hole extending from a major surface thereof to a rear surface opposite to the major surface; a driving IC provided on the major surface of the optoelectric film and electrically connected to the electrical interconnect layer, and provided above the through hole in the optoelectric film; an optical semiconductor device provided on the major surface of the optoelectric film and driven by the driving IC; a heat dissipation plate provided on the rear surface of the optoelectric film and covering the through hole such that a part of the through hole is protruded from an outer edge of the driving IC in a view perpendicular to the major surface; and a thermally conductive material provided in the through hole and being in contact with the driving IC and the heat dissipation plate.

According to another aspect of the invention, there is provided a flexible optoelectric interconnect including: an optoelectric film having an electrical interconnect made of a single layer and an optical interconnect layer including an optical waveguide core and an optical waveguide clad, the optoelectric film having a through hole extending from a major surface thereof to a rear surface opposite to the major surface; and a pair of driving modules provided on the optoelectric film, each of the driving modules including at least one of optical transmitter portion and optical receiver portion, the driving module including: a semiconductor device connection electrical interconnect layer made of a single layer which is formed on the optoelectric film and is connected with the electrical interconnect: a driving IC provided on a major surface of the optoelectric film and electrically connected to the semiconductor device connection electrical interconnect layer, and provided above the through hole in the optoelectric film; an optical semiconductor device provided on the major surface of the optoelectric film, the optical semiconductor device being capable of being coupled with the optoelectric interconnect and driven by the driving IC; a heat dissipation plate provided on the rear surface of the optoelectric film and covering the through hole such that a part of the through hole is protruded from an outer edge of the driving IC in a view perpendicular to the major surface; and a thermally conductive material provided in the through hole and being in contact with the driving IC and the heat dissipation plate.

BRIEF DESCRIPTION OF THE DRAWINGS

In FIGS. 1 to 3, an optical transmitter portion (or optical receiver portion) and an electrical interconnect portion for semiconductor device connection are extracted for illustration.

DETAILED DESCRIPTION OF THE INVENTION

Comparative Example

Figure 1:
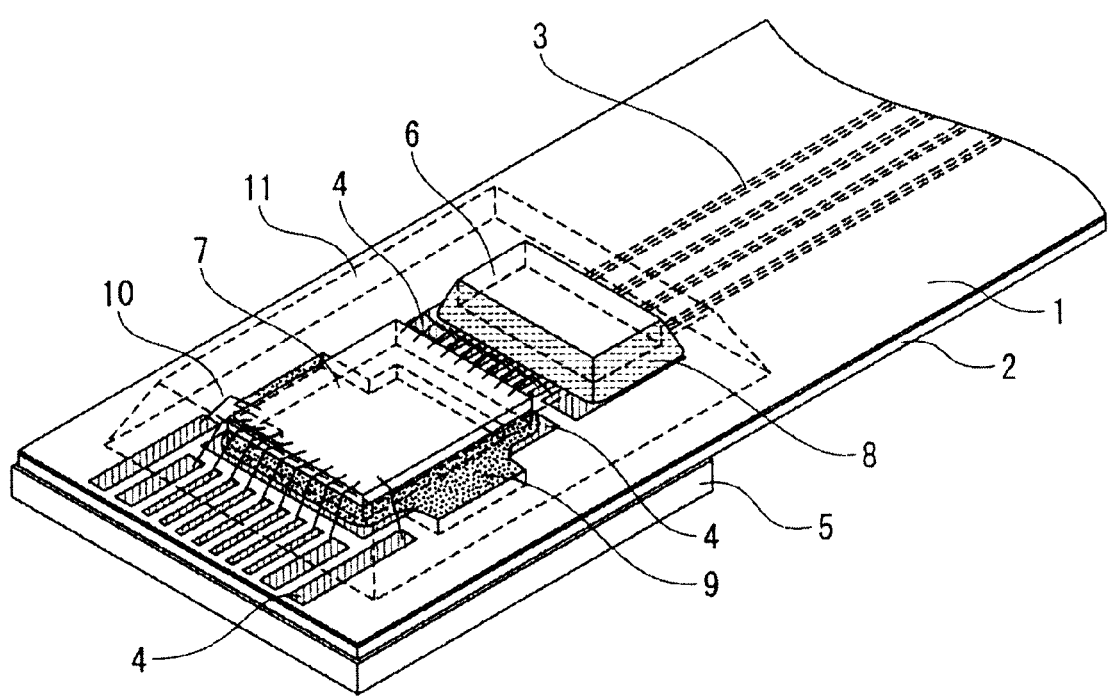
FIG. 1 is a schematic perspective view showing a flexible optoelectric interconnect according to a first embodiment of the invention.

A flexible optoelectric interconnect according to the conventional art disclosed in JP-A 2003-227951 (Kokai) is capable of not only mounting an optical device on itself, but also mounting a driving IC (semiconductor chip) for the optical device to serve as a module in which they are electrically connected. However, heat dissipation of the semiconductor chip is not sufficiently considered, and may cause problems in practice.

For example, in a heat dissipation method of providing thermal vias below the semiconductor chip, the flexible substrate needs two or more electrical interconnect layers, which significantly increase the cost as compared with single-layer electrical interconnection. There is also a problem of the thermal resistance of thermal vias, which cannot be sufficiently reduced.

Alternatively, in a conventional heat dissipation method disclosed in JP-A 2003-227951 (Kokai), a through hole large enough to enclose a semiconductor chip is provided in an optoelectric film so that the semiconductor chip is embedded in the through hole. However, this method needs a processing margin for die punching a through hole and an alignment margin for the die, as well as a processing margin for cutting out the semiconductor chip. Thus, the through hole requires a size allowance of at least several 100 μm, or possibly about several mm.

Hence, in the case of parallel mounting a plurality of semiconductor chips, for example, the conventional configuration needs an arrangement pitch margin of several 100 μm to several mm in addition to the minimum arrangement pitch determined by the pattern layout of electrical interconnection. That is, the conventional art is structurally limited in mounting density and likely to cause a flexible optoelectric interconnect having multiparallel optoelectric interconnection to increase in size.

Furthermore, in the method of mounting a semiconductor chip by through hole insertion and the method of forming a through hole within the outline of the semiconductor chip as in the conventional art, there is a problem of being likely to decrease the yield in the process of curing a thermally conductive resin paste.

More specifically, in the method of inserting a semiconductor chip into a through hole, a large amount of thermally conductive resin paste filled in the gap between the through hole and the semiconductor chip may rise up in the curing process due to fluidization and strain and overflow on the connection pad of the semiconductor chip. This is likely to cause a problem of short-circuiting the electrode.

This is attributed to the configuration that tends to place the surface of the semiconductor chip near the surface of the thermally conductive resin paste, and to the capillary phenomenon by which the thermally conductive resin paste is likely to accumulate in the through hole gap at the side surface of the semiconductor chip.

On the other hand, in the method of forming a through hole within the outline of the semiconductor chip, a large amount of thermally conductive resin paste filled in the through hole is likely to present a problem of pushing up the semiconductor chip in the curing process because the evaporation path of solvent is occluded. This causes mounting misalignment and tilt of the semiconductor chip, and in extreme cases, the semiconductor chip may be raised vertically. These obviously cause failure in all the subsequent process.

Furthermore, an optoelectric film has an optical waveguide inside, and hence necessarily needs a certain thickness, which causes a problem of low heat dissipation. The optical device constituting the flexible optoelectric interconnect has larger characteristics variation induced by heat than the semiconductor chip such as the driving IC. Thus, it is important to ensure a heat dissipation path for the semiconductor chip, which is a major heat source. Furthermore, the large thermal expansion coefficient of the optoelectric film may cause the misalignment of the optical waveguide core, which possibly results in coupling failure between the optical semiconductor device and the optical waveguide core. Hence, it is an important problem to ensure a heat dissipation path for the driving IC and reduce thermal conduction from the driving IC to the optical device. In relation to the above problems recognized by the applicant, embodiments of the invention will now be described with reference to the drawings.

First Embodiment

Figure 2:
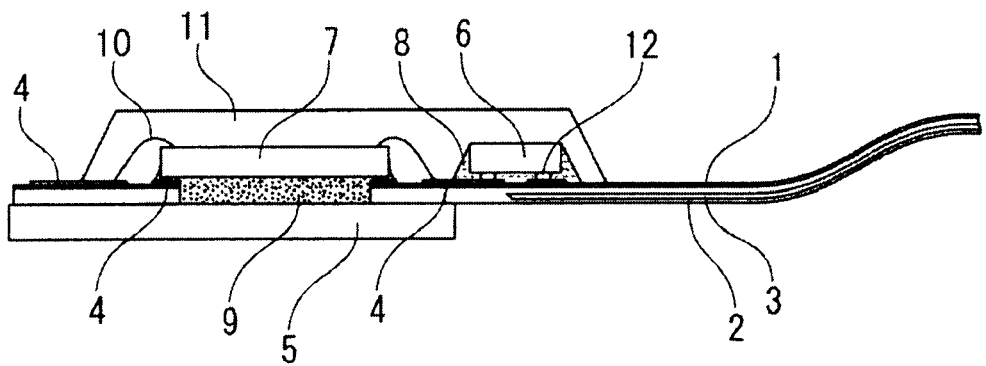
FIG. 2 is a cross-sectional view showing the flexible optoelectric interconnect according to the first embodiment of the invention.
Figure 3:
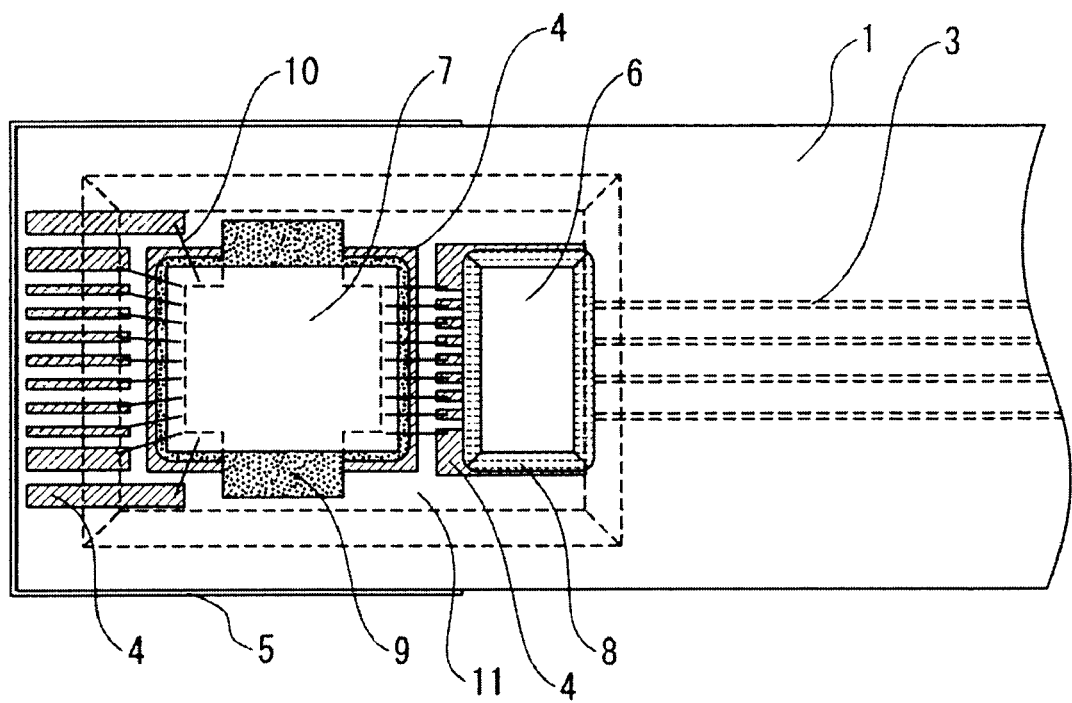
FIG. 3 is a top view showing the flexible optoelectric interconnect according to the first embodiment of the invention.
Figure 4:
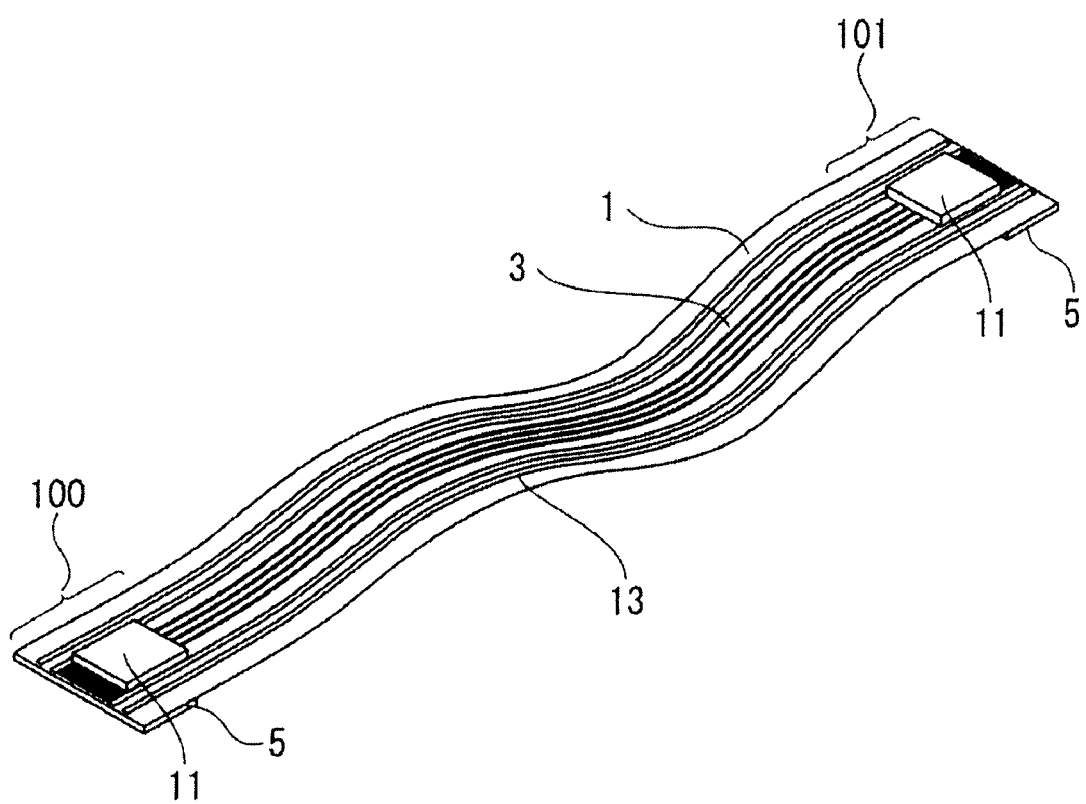
FIG. 4 is an overall view showing the schematic configuration of the flexible optoelectric interconnect according to the first embodiment of the invention.

FIG. 1 is a schematic perspective view showing a flexible optoelectric interconnect according to a first embodiment of the invention. FIG. 2 is a cross-sectional view showing the flexible optoelectric interconnect according to the first embodiment of the invention. FIG. 3 is a top view showing the flexible optoelectric interconnect according to the first embodiment of the invention. In FIGS. 1 to 3, an optical transmitter portion (or optical receiver portion) and an electrical interconnect portion for semiconductor device connection are extracted for illustration. FIG. 4 is an overall view showing the schematic configuration of the flexible optoelectric interconnect according to the first embodiment of the invention.

As shown in FIG. 4, the flexible optoelectric interconnect according to the first embodiment includes a driving module 100 and a driving module 101. The driving module 100 and the driving module 101 include an optical transmitter portion or an optical receiver portion, or both of them. The optical transmitter portion and the optical receiver portion are paired with each other through an optical waveguide to serve as an optical interconnect. In the following, the driving module 100 is described in detail with reference to FIGS. 1 to 4. Naturally, a similar description is also applicable to the driving module 101.

The driving module 100 includes a base film 1, an optical waveguide clad 2, an optical waveguide core 3, a semiconductor device connection electrical interconnect 4, a heat dissipation plate 5, an optical semiconductor device 6 (light emitting device or light receiving device), a driving IC 7, an underfill resin 8, a thermally conductive resin 9, a bonding wire 10, a molding resin 11, a bump metal 12, and an electrical interconnect 13.

The base film 1, the optical waveguide clad 2, the optical waveguide core 3, the semiconductor device connection electrical interconnect 4, and the electrical interconnect 13 constitute a flexible optoelectric film which can be freely folded. In the following, the surface on which the semiconductor device connection electrical interconnect 4 and the electrical interconnect 13 are formed and the optical semiconductor device 6 and the driving IC 7 are provided is referred to as the major surface of the optoelectric film, and the surface on which the heat dissipation plate 5 is provided (the surface opposite to the major surface) is referred to as the rear surface of the optoelectric film.

The base film 1 is illustratively made of a polyimide film having a thickness of 25 μm. The optical waveguide clad 2 is formed on the rear surface of the base film 1, and an electrical interconnect layer described below is formed on the front surface of the base film 1.

The optical waveguide clad 2 and the optical waveguide core 3 are different in refractive index from each other, are made of materials transparent to the optical transmission wavelength, and constitute an optical interconnect layer. The optical waveguide clad 2 and the optical waveguide core 3 are illustratively made of an epoxy resin. The refractive index of the optical waveguide core 3 is illustratively 1.59, and the refractive index of the optical waveguide clad 2 is illustratively 1.56. Thus, they constitute an optical waveguide having an NA (numerical aperture) of approximately 0.3.

The optical waveguide core 3 illustratively has a rectangular cross section of 40 µm square. The optical waveguide clad 2 surrounding the optical waveguide core 3 is illustratively formed with a thickness of 15 µm toward the major surface of the optoelectric film and 15 µm toward the rear surface of the optoelectric film.

The end of the optical waveguide core 3 is beveled at 45°, and a mirror metal, not shown (e.g., Au) is provided on this 45° beveled surface. This mirror metal serves to bend the input/output light of the optical semiconductor device 6 at 90°, allowing optical transmission to the in-plane direction of the optoelectric film through the optical interconnect layer (the optical waveguide clad 2 and the optical waveguide core 3).

The semiconductor device connection electrical interconnect 4 and the electrical interconnect 13 are located in the same electrical interconnect layer and formed by one step of patterning based on photolithography. Thus, the electrical interconnect layer made of a single layer only needs one step of patterning, and does not need the steps of via formation and through hole plating, which are required for a multilayer substrate having two or more layers. Hence, it can be fabricated at very low cost. The semiconductor device connection electrical interconnect 4 and the electrical interconnect 13 are illustratively made of Cu having a thickness of 12 µm, and the pad portion thereof is provided with Au/Ni plating. The semiconductor device connection electrical interconnect 4 serves for electrical connection of semiconductor devices such as the optical semiconductor device 6 and the driving IC 7, and the electrical interconnect 13 serves for low-speed signals between the ends of the optoelectric film and for connection to power supply.

As shown in FIG. 2, below the mounting portion of the driving IC 7, the above optoelectric film has a through hole passing through from the electrical interconnect layer to the optical interconnect layer, that is, extending from the major surface side to the rear surface side of the optoelectric film. This through hole is provided outside the underlying region of the portion wire-bonded to the driving IC 7.

As shown in FIGS. 1 and 3, the through hole (inside the dashed line) is provided in the portion not used for wire-bonding the driving IC 7, and has a shape protruding (projected) from the outer edge (outline) of the driving IC 7 by e.g. approximately 0.5 to 1 mm. The size of this portion of the through hole protruding from the outer edge of the driving IC 7 can be determined in accordance with the extent of the margin of the interconnection pattern of the flexible optoelectric interconnect, taking into consideration the cross-sectional area and thermal resistance of the heat dissipation path. The shape of the through hole can be the superposition of two rectangles (cruciform) as shown in FIG. 3, or can be the superposition of a circle and a rectangle, or an ellipse. The through hole is protruded from the outline of the driving IC 7 toward a direction perpendicular to a longitudinal direction of the base film 1.

The heat dissipation plate 5, which is illustratively a Cu plate having a thickness of 500 µm and has a larger area, at least, than the mounting portion of the driving IC 7, is laminated to the bottom (rear surface side of the optoelectric film) of the optical interconnect layer. The heat dissipation plate 5 covers the through hole formed below the mounting portion of the driving IC 7. Heat generated from the driving IC 7 passes through the thermally conductive resin 9 described below to the heat dissipation plate 5, where it is emitted (dissipated).

The heat dissipation plate 5 is provided outside the directly underlying portion of the optical semiconductor device 6 in the in-plane direction of the optoelectric film in order to reduce thermal conduction from the driving IC 7 to the optical semiconductor device 6, or from the driving IC 7 to the optical coupling portion at the end of the optical waveguide core 3. The heat dissipation plate 5 also serves for termination (as a reinforcement member) of the end of the flexible optoelectric interconnect. For example, the flexible optoelectric interconnect can be configured so that its end can be mated and demated with the mounting substrate connector together with the heat dissipation plate 5.

The optical semiconductor device 6 is a light emitting device or a light receiving device, or a composite device thereof, provided on the major surface side of the optoelectric film and controlled for light emission or light reception by the driving IC 7. In the optical transmitter portion, a light emitting device (e.g., surface-emitting laser) can be used as the optical semiconductor device 6. In the optical receiver portion, a light receiving device (e.g., surface-receiving photodiode) can be used as the optical semiconductor device 6. For bidirectional optical transmission, a one-chip device including both the light emitting device and the light receiving device can be used. Alternatively, half-duplex optical transmission (ping-pong transmission) can be realized using a light emitting device for every optical semiconductor device 6, which is forward biased to emit light during light transmission, and reverse biased to serve as a light receiving device during light reception. The optical semiconductor device 6 is connected to the electrical interconnect 4 through the bump metal 12. The bump metal 12 is illustratively an Au stud bump or solder bump. Epoxy resin is illustratively applied as an insulative underfill resin 8 around the bump connection portion.

The driving IC 7 is fixed onto the thermally conductive resin 9 filled in the above-described through hole. The driving IC 7 is a driver IC used in the optical transmitter portion to cause a light emitting device to emit light in response to an external input electrical signal, or a receiver IC used in the optical receiver portion to reproduce an external output electrical signal from the photocurrent of a light receiving device. In the case of half-duplex optical transmission described above, the driving IC 7 can be a driver/receiver composite IC. The driving IC 7 can also serve for an operation control function to stop optical transmission/reception operation by disabling the driving bias to the optical semiconductor device 6 irrespective of the presence or absence of external electrical signals and optical signals.

The thermally conductive resin 9 is a material having a higher thermal conductivity than the optoelectric film (except the electrical interconnect layer), such as resin including metal powder (for example cured Ag paste), is filled in the above-described through hole formed in the optoelectric film, and fills the space surrounded by the heat dissipation plate 5 and the driving IC 7. The thermally conductive resin 9 is also thinly applied to the portion for mounting the driving IC 7. The driving IC 7 is mounted with its circuit side facing upward (to the direction not facing the optoelectric film), and the surface opposite to the circuit side is in contact with the thermally conductive resin 9.

The bonding wire 10 (e.g., Au wire or Al wire) electrically connects between the semiconductor device connection electrical interconnect 4 and the driving IC 7. In the first embodiment, the circuit side of the driving IC 7 faces upward, and hence the driving IC 7 is connected to the electrical interconnect layer by wire bonding.

The molding resin 11 entirely molds the semiconductor device mounting portion including the optical semiconductor device 6 and the driving IC 7 described above. The molding resin 11 shown in FIG. 4 contains the transmitter/receiver portion of the flexible optoelectric interconnect as shown in FIGS. 1 to 3.

The flexible optoelectric interconnect having the above configuration can effectively ensure a heat dissipation path to the rear surface of the optoelectric film even in a single-layer configuration in which the semiconductor device connection electrical interconnect 4 and the electrical interconnect 13 are inexpensive. Furthermore, the cross-sectional area of the heat dissipation path larger than the chip area of the driving IC 7 can be ensured, and the resulting heat dissipation effect is higher than that of a through hole having a size comparable to the chip area of the driving IC 7. That is, heat dissipation of the driving IC 7 is performed through a through hole formed in the optoelectric film, and the through hole is shaped to partly protrude from the outer edge of the driving IC 7. This enhances heat dissipation and reduces thermal conduction to the optical semiconductor device 6.

In the heat dissipation method as in the comparative example, a through hole large enough to enclose a semiconductor chip is provided in an optoelectric film so that the semiconductor chip is embedded in the through hole. However, this method needs a processing margin for die punching a through hole and an alignment margin for the die, as well as a processing margin for cutting out the semiconductor chip.

In contrast, in the flexible optoelectric interconnect according to the first embodiment, the driving IC 7 is surrounded by free space. Hence, even if the through hole is formed by die punching, the outline error of the driving IC 7 and the size error of the through hole are unlikely to cause a crucial problem. Furthermore, the misalignment of the through hole, which, if any, is the only source of trouble, is as small as several 10 μm. Hence, the size margin of the through hole can be reduced to several 10 μm. Thus, even in the case of parallel mounting a plurality of driving ICs, the driving ICs can be parallel mounted with high density at a substantially minimum arrangement pitch for the pattern layout of electrical interconnection.

Furthermore, the heat dissipation plate 5 is provided outside the directly underlying portion of the optical semiconductor device 6 in the in-plane direction of the optoelectric film. This can reduce thermal conduction from the driving IC 7 to the optical semiconductor device 6, and prevent coupling failure between the optical semiconductor device 6 and the optical waveguide core 3. Thus, the optical semiconductor device 6 can be stably and reliably operated without being affected by the temperature variation of the driving IC 7.

Next, a process for manufacturing the flexible optoelectric interconnect shown in FIGS. 1 to 4 is described.

First, a Cu foil illustratively having a thickness of 12 μm is laminated to a base film 1 (e.g., a polyimide film having a thickness of 25 μm), and an optical waveguide clad 2 and an optical waveguide core 3 made of an epoxy resin or other material are formed on the rear surface (the surface without the Cu foil) of the base film 1. In this step, for example, a film of the lower clad layer is laminated to a film of the core layer, the optical waveguide core 3 is patterned by photolithography, and a film of the upper clad layer is laminated thereto. It is also possible to form each resin layer by spin coating and heat treatment of liquid resin. The refractive index of the optical waveguide core 3 is illustratively 1.59, and the refractive index of the optical waveguide clad 2 is illustratively 1.56.

Next, as shown in FIG. 2, the end of the optical waveguide core 3 is beveled at 45°, and a mirror metal (e.g., Au) is provided on the 45° beveled surface. The 45° bevel processing at the end of the optical waveguide core 3 can be based on dicing or excimer laser processing. The mirror metal is formed illustratively by selective evaporation (resistance heating, sputtering, etc.) using a metal mask.

Next, the portion other than the electrical connection pad (not shown) is illustratively covered with a solder resist having a thickness of 30 μm, and the pad portion is provided with Au/Ni plating. The bump metal 12 is illustratively an Au stud bump and connects the optical semiconductor device 6 to the electrical interconnect 4 by thermocompression bonding or supersonic connection. Alternatively, the bump metal 12 can be a solder bump and connected by heat-melting.

Next, an underfill resin 8 (e.g., epoxy resin) is applied around the bump connection portion and cured (heating, UV irradiation, etc.) for reinforcement.

Next, as shown in FIG. 2, a through hole (the portion to be filled with a thermally conductive resin 9) passing through from the electrical interconnect layer to the optical interconnect layer is provided below the mounting portion of the driving IC 7. This processing can be realized by die punching or the like, and the processing cost is very low. As shown in FIG. 2, the through hole is provided outside the underlying region of the portion wire-bonded to the driving IC 7. This is intended for ensuring strength in wire bonding. Furthermore, as shown in FIGS. 1 and 3, the through hole (inside the dashed line) is formed in the portion not used for wire-bonding the driving IC 7, and has a shape protruding from the outer edge of the driving IC 7 by e.g. approximately 0.5 to 1 mm.

Next, a heat dissipation plate 5 having a larger area, at least, than the mounting portion of the driving IC 7 is laminated to the bottom (rear surface side of the optoelectric film) of the optical interconnect layer. The heat dissipation plate 5 is illustratively a Cu plate having a thickness of 500 μm.

Next, this through hole is filled with a thermally conductive resin 9 (e.g., Ag paste) in paste form, which is also thinly applied to the portion for mounting the driving IC 7, and the driving IC 7 is mounted. Then, the thermally conductive resin 9 is cured (heating, UV irradiation, etc.) to fix the driving IC 7.

Next, the semiconductor device connection electrical interconnect 4 is electrically connected to the driving IC 7 through a bonding wire 10 (e.g., Au wire or Al wire), and the semiconductor device mounting portion is entirely sealed with a molding resin 11.

By the foregoing process, the flexible optoelectric interconnect shown in FIGS. 1 to 4 is obtained.

In the method of mounting a semiconductor chip by through hole insertion and the method of forming a through hole within the outline of the semiconductor chip as in the above comparative example, there is a problem of being likely to decrease the yield in the process of curing a thermally conductive resin paste.

In contrast, in the flexible optoelectric interconnect according to the first embodiment, the thermally conductive resin 9 in paste form is located below the semiconductor chip such as the driving IC 7. Hence, rising up of the thermally conductive resin 9 in paste form is less likely to cause trouble in the curing process. Furthermore, the portion of the through hole protruding from the outer edge of the semiconductor chip such as the driving IC 7 can prevent the driving IC 7 from being lifted up by expelled solvent in the curing process.

Thus, the flexible optoelectric interconnect and the method for manufacturing the same according to the first embodiment can provide high performance in heat dissipation even using a low-cost, single-layer electrical interconnect. Furthermore, the decrease of mounting density and manufacturing yield can be minimized. Thus, a flexible optoelectric interconnect with low cost and high performance can be obtained.

Hence, this embodiment can realize optical interconnection in mounting boards at low cost, and contribute to the sophistication of information and communication devices by enhancing the operating speed and performance of mounting boards.

Second Embodiment

Figure 5:
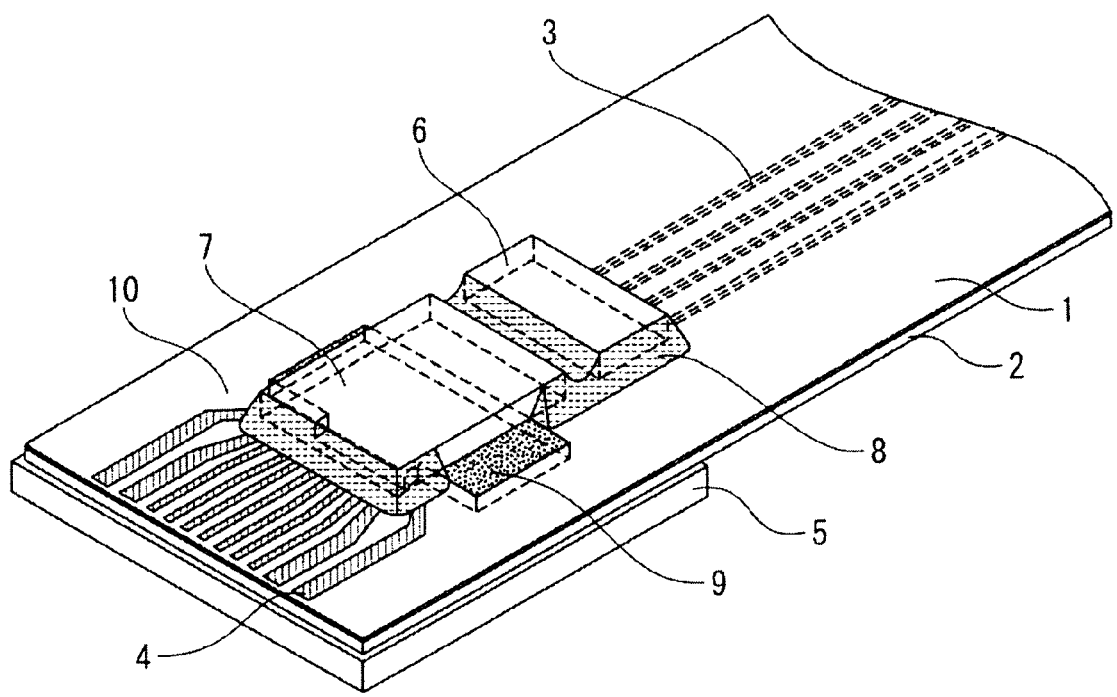
FIG. 5 is a schematic perspective view showing a flexible optoelectric interconnect according to a second embodiment of the invention.
Figure 6:
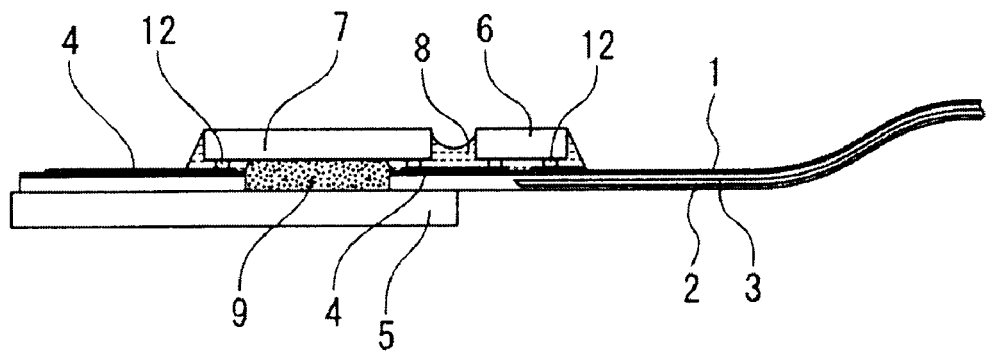
FIG. 6 is a cross-sectional view showing the flexible optoelectric interconnect according to the second embodiment of the invention.
Figure 7:
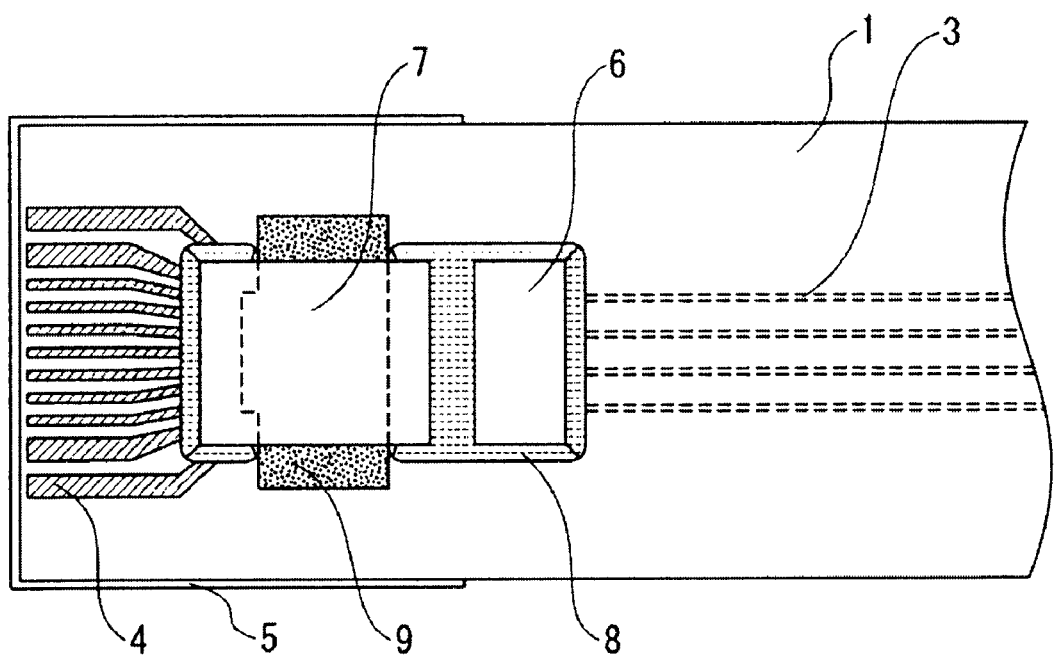
FIG. 7 is a top view showing the flexible optoelectric interconnect according to the second embodiment of the invention.

FIG. 5 is a schematic perspective view showing a flexible optoelectric interconnect according to a second embodiment of the invention. FIG. 6 is a cross-sectional view showing the flexible optoelectric interconnect according to the second embodiment of the invention. FIG. 7 is a top view showing the flexible optoelectric interconnect according to the second embodiment of the invention. In FIGS. 5 to 7, an optical transmitter portion (or optical receiver portion) and an electrical interconnect portion for semiconductor device connection are extracted for illustration, and the schematic overall configuration thereof is the same as in FIG. 4.

The components substantially identical to those in the first embodiment are labeled with like reference numerals, and the description thereof is not duplicated. The second embodiment is different in that the driving IC 7 is electrically connected by the so-called flip chip connection rather than wire bonding, and that the heat dissipation of the driving IC 7 is directed to the frontside (circuit side) of the chip.

In flip chip connection, the molding resin 11 is not necessarily needed, and is not used here as shown in FIGS. 5 to 7. Conversely, flip chip connection requires that a thermally conductive resin (typically, electrically conductive resin such as Ag paste) be in contact with the circuit side of the driving IC 7 for heat dissipation. Here, unfortunately, if it is in contact with the electrode pad or the bump metal, a short circuit simply occurs and loses the function.

The simplest solution is to use a material having both insulation property and thermal conductivity. However, currently available resins satisfying both of them are often poor in high frequency characteristics because of high dielectric loss, or inadequate for protecting the semiconductor chip and the metal bump connection portion against thermal cycling. Hence, the second embodiment needs ingenuity in its configuration and manufacturing method, which are desirably implemented as described below.

The flexible optoelectric interconnect according to the second embodiment includes a base film 1, an optical waveguide clad 2, an optical waveguide core 3, a semiconductor device connection electrical interconnect 4, a heat dissipation plate 5, an optical semiconductor device 6 (light emitting device or light receiving device), a driving IC 7, an underfill resin 8, a thermally conductive resin 9, and a bump metal 12.

An insulative underfill resin 8 is filled around the bump metal 12, which connects the optical semiconductor device 6 and the driving IC 7 to the semiconductor device connection electrical interconnect 4, to protect and insulate the electrical connection portion. On the other hand, the through hole (shaped like in the first embodiment) formed below the driving IC 7 is filled with a thermally conductive resin 9, which is made of a material different from the underfill resin 8, and the thermally conductive resin (electrically conductive resin) 9 is in contact with the circuit side of the driving IC 7.

In the flexible optoelectric interconnect according to the second embodiment, resins with confirmed reliability and performance are used in combination to realize heat dissipation of the driving IC 7 in flip chip connection. More specifically, the underfill resin 8 is selectively formed on the bump metal 12 and the connection pad portion, whereas the through hole formed below the remaining portion of the driving IC 7 (the portion not in contact with the underfill resin 8) is filled with the thermally conductive resin 9. Thus, both insulation property and heat dissipation are satisfied.

In addition to the same effects as in the first embodiment, the flexible optoelectric interconnect according to the second embodiment achieves the effect of dissipating heat from the chip frontside (the circuit side of the driving IC 7), which has high heat generation. Hence, thermal conduction from the driving IC 7 to the optical semiconductor device 6 can be further reduced. Furthermore, electrical connection from the optical semiconductor device 6 to the driving IC 7 can be implemented with minimum distance, which facilitates enhancing the operating speed.

Furthermore, the through hole formed like in the first embodiment plays an important role in the method for manufacturing a flexible optoelectric interconnect according to the second embodiment. In the following, a process for manufacturing the flexible optoelectric interconnect shown in FIGS. 5 to 7 is described in conjunction with the reason that this through hole plays an important role.

First, like in the first embodiment, a Cu foil is laminated to a base film 1, and an optical waveguide clad 2 and an optical waveguide core 3 are formed thereon. Next, a semiconductor device connection electrical interconnect 4 and an electrical interconnect 13 are formed to obtain an optoelectric film.

Next, a through hole is provided in a configuration avoiding the electrical connection pad portion of the optoelectric film and partly protruding from the outer edge of the driving IC 7. Next, a heat dissipation plate 5 is bonded to the bottom of the optical interconnect layer, and the optical semiconductor device 6 and the driving IC 7 are flip-chip connected using a bump metal 12. Here, the bump metal 12 is illustratively an Au stud bump, connected to the semiconductor device connection electrical interconnect 4 by thermocompression bonding or supersonic connection. Alternatively, the bump metal 12 can be a solder bump and connected by heat-melting.

Next, an underfill resin 8 is injected into the side portion of the optical semiconductor device 6 and the driving IC 7. Here, injection of the underfill resin 8 into the region where the driving IC 7 faces the optoelectric film can be automatically stopped at the boundary of the through hole by suitably controlling the injected amount of the underfill resin 8.

More specifically, the gap between the driving IC 7 and the optoelectric film reaches discontinuity at the periphery of the through hole, which serves as a stopping boundary of capillarity. Here, if an extremely large amount of underfill resin 8 is injected, the underfill resin 8 may flow into the through hole from the through hole boundary due to the pressure of the resin. However, this is the case of a considerably extreme amount of resin. In substance, it can be safely said that the resin stops at the through hole boundary.

Next, the underfill resin 8 is heated to evaporate solvent for curing. At this time, the heat treatment is performed with sufficient ventilation to eliminate any residual solvent of the resin. Next, a thermally conductive resin 9 is injected from the through hole opening at the side surface of the chip.

In the above method for manufacturing a flexible optoelectric interconnect, the through hole is formed to protrude from the outer edge of the driving IC 7, and the protruding through hole serves as an injection window for the thermally conductive resin 9, which facilitates injection of the resin.

Furthermore, the electrical connection portion of the optical semiconductor device 6 and the driving IC 7 is insulated by the underfill resin 8. Hence, even if the thermally conductive resin (typically, electrically conductive resin) overflows a little from the opposite side of the through hole, it is less likely to cause trouble such as short-circuiting the electrical terminals of the driving IC 7. Indeed, the thermally conductive resin can be injected in excess to prevent air bubbles from being enclosed below the driving IC 7.

Variations

This invention is not limited to the above first and second embodiment, but can be variously modified in practice without departing from the spirit thereof. For example, in the foregoing, the base film is illustratively made of polyimide resin, but other materials such as urethane resin and acrylic resin can be used depending on the purpose. Furthermore, the optical waveguide is illustratively made of an epoxy resin, but other materials such as a polyimide resin, a silicone resin, and an acrylic resin can be used. That is, these are only illustrative configurations, and other means (materials, dimensions, etc.) can be used for each element within the spirit of the invention. Furthermore, the embodiments can be practiced in combination. Moreover, this invention can be practiced in various other modifications without departing from the spirit thereof.

The first and second embodiment include various aspects of the invention, and various embodiments of the invention can be extracted as suitable combinations of the disclosed elements. For example, even if one or more elements are deleted from the entirety of the elements disclosed in the present embodiments, the configuration lacking the deleted elements can be extracted as an embodiment of the invention as long as it can solve at least one of the problems described above and achieve at least one of the effects described above.

The invention claimed is:

1. A flexible optoelectric interconnect, comprising:
   an optoelectric film having an electrical interconnect layer made of a single metal layer and an optical interconnect layer including an optical waveguide core and an optical waveguide clad, the optoelectric film having a through hole extending from a major surface thereof to a rear surface opposite to the major surface;
   a driving IC provided on the major surface of the optoelectric film and electrically connected to the electrical interconnect layer, and provided above the through hole in the optoelectric film;
   an optical semiconductor device provided on the major surface of the optoelectric film and driven by the driving IC;
   a heat dissipation plate provided on the rear surface of the optoelectric film and covering the through hole such that a part of the through hole is protruded from an outer edge of the driving IC in a view perpendicular to the major surface; and
   a thermally conductive material provided in the through hole and being in contact with the driving IC and the heat dissipation plate.

2. The flexible optoelectric interconnect according to claim 1, further comprising:
   an electrical connection portion in which the electrical interconnect layer is wire-bonded to the driving IC,
   wherein the thermally conductive material is in contact with a surface opposite to a circuit side of the driving IC.

3. The flexible optoelectric interconnect according to claim 1, further comprising:
   an electrical connection portion in which the electrical interconnect layer is flip-chip connected to the driving IC; and
   an insulative underfill resin provided around the electrical connection portion,
   wherein the thermally conductive material is in contact with a circuit side of the driving IC.

4. The flexible optoelectric interconnect according to claim 3, wherein the thermally conductive material is a conductive resin including metal powder.

5. The flexible optoelectric interconnect according to claim 1, wherein the heat dissipation plate is provided outside a directly underlying portion of an optical coupling portion at an end of the optical waveguide core in an in-plane direction of the optoelectric film.

6. The flexible optoelectric interconnect according to claim 1, wherein the heat dissipation plate is provided outside a directly underlying portion of the optical semiconductor device in an in-plane direction of the optoelectric film.

7. The flexible optoelectric interconnect according to claim 1, wherein the electrical interconnect layer and the optical interconnect layer are formed on a resin film, and the thermally conductive material is a material having a higher thermal conductivity than the resin film.

8. The flexible optoelectric interconnect according to claim 1, wherein the optical waveguide core and the optical waveguide clad are made of materials transparent to an optical transmission wavelength, and the thermally conductive material is a resin material having a higher thermal conductivity than the optical waveguide core and the optical waveguide clad.

9. The flexible optoelectric interconnect according to claim 1 wherein the heat dissipation plate is provided at an end to be mated with a connector, and the end is able to be mated and demated with the connector together with the heat dissipation plate.

10. A flexible optoelectric interconnect, comprising:
    an optoelectric film having an electrical interconnect made of a single metal layer and an optical interconnect layer including an optical waveguide core and an optical waveguide clad, the optoelectric film having a through hole extending from a major surface thereof to a rear surface opposite to the major surface; and
    a pair of driving modules provided on the optoelectric film, each of the driving modules including at least one of an optical transmitter portion and an optical receiver portion,
    the driving modules including:
      a semiconductor device connection electrical interconnect layer made of a single metal layer which is formed on the optoelectric film and is connected with the electrical interconnect:
      a driving IC provided on a major surface of the optoelectric film and electrically connected to the semiconductor device connection electrical interconnect layer, and provided above the through hole in the optoelectric film;
      an optical semiconductor device provided on the major surface of the optoelectric film, the optical semiconductor device being capable of being coupled with the optoelectric interconnect and driven by the driving IC;
      a heat dissipation plate provided on the rear surface of the optoelectric film and covering the through hole such that a part of the through hole is protruded from an outer edge of the driving IC in a view perpendicular to the major surface; and a thermally conductive material provided in the through hole and being in contact with the driving IC and the heat dissipation plate.

11. The flexible optoelectric interconnect according to claim 10, further comprising:
an electrical connection portion in which the semiconductor device connection electrical interconnect layer is wire-bonded to the driving IC,
wherein the thermally conductive material is in contact with a surface opposite to a circuit side of the driving IC.

12. The flexible optoelectric interconnect according to claim 10, further comprising:
an electrical connection portion in which the semiconductor device connection electrical interconnect layer is flip-chip connected to the driving IC; and
an insulative underfill resin provided around the electrical connection portion,
wherein the thermally conductive material is in contact with a circuit side of the driving IC.

13. The flexible optoelectric interconnect according to claim 12, wherein the thermally conductive material is a conductive resin including metal powder.

14. The flexible optoelectric interconnect according to claim 10, wherein the heat dissipation plate is provided outside a directly underlying portion of an optical coupling portion at an end of the optical waveguide core in an in-plane direction of the optoelectric film.

15. The flexible optoelectric interconnect according to claim 10, wherein the heat dissipation plate is provided outside a directly underlying portion of the optical semiconductor device in an in-plane direction of the optoelectric film.

16. The flexible optoelectric interconnect according to claim 10, wherein the semiconductor device connection electrical interconnect layer and the optical interconnect layer are formed on a resin film, and the thermally conductive material is a material having a higher thermal conductivity than the resin film.

17. The flexible optoelectric interconnect according to claim 10, wherein the optical waveguide core and the optical waveguide clad are made of materials transparent to an optical transmission wavelength, and the thermally conductive material is a resin material having a higher thermal conductivity than the optical waveguide core and the optical waveguide clad.

18. The flexible optoelectric interconnect according to claim 10, wherein the heat dissipation plate is provided at an end to be mated with a connector, and the end is able to be mated and demated with the connector together with the heat dissipation plate.

19. The flexible optoelectric interconnect according to claim 10, wherein the semiconductor device connection electrical interconnect layer and the electrical interconnect are in a same electrical interconnect layer.

20. The flexible optoelectric interconnect according to claim 10, wherein
the driving IC and the heat dissipation plate included in one of the pair of driving modules are provided more remote from the optical semiconductor device included in the one of the pair of driving modules, and closer to one end of the optoelectric film, and
the driving IC and the heat dissipation plate included in the other of the pair of driving modules are provided more remote from the optical semiconductor device included in the other of the pair of driving modules, and closer to the other end of the optoelectric film.

* * * * *